(12) United States Patent
Valine

(10) Patent No.: US 6,759,768 B2
(45) Date of Patent: Jul. 6, 2004

(54) REPEATER METHODS FOR CONSTRAINED PITCH WIRE BUSES ON INTEGRATED CIRCUITS

(75) Inventor: Thomas Valine, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 198 days.

(21) Appl. No.: 10/174,835

(22) Filed: Jun. 19, 2002

(65) Prior Publication Data

US 2003/0234583 A1 Dec. 25, 2003

(51) Int. Cl.$^7$ .............................................. H01B 11/02
(52) U.S. Cl. ................................................... 307/147
(58) Field of Search ................................ 307/147, 148; 326/81, 82, 83, 86; 710/130, 305; 370/246, 445, 501

(56) References Cited

U.S. PATENT DOCUMENTS 5,832,244 A * 11/1998 Jolley et al. ................ 710/305
6,101,169 A * 8/2000 Fahey ......................... 370/246
6,295,277 B1 * 9/2001 Fahey ......................... 370/246

* cited by examiner

Primary Examiner—Pia Tibbits
(74) Attorney, Agent, or Firm—Gunnison, McKay & Hodgson, L.L.P.; Lisa A. Norris (57) ABSTRACT

Methods and devices for implementing repeaters in integrated circuit wire buses having a pre-determined wire pitch, such as a minimum wire pitch, are described. In one embodiment, a parameterized bus repeater circuit cell of variable length having a width of three times the wire pitch of the bus to be repeated is described. In another embodiment, a bus repeater circuit block having a plurality of individual bus repeater circuit cells is described. The embodiments of the present invention are readily adaptable to design implementations using computer-aided design tools to provide automated placement and array of the bus repeater circuit cells and bus repeater circuit blocks.

25 Claims, 9 Drawing Sheets

REPEATER METHODS FOR CONSTRAINED PITCH WIRE BUSES ON INTEGRATED CIRCUITS

BACKGROUND OF THE INVENTION

1. Field of the Invention

The present invention relates generally to integrated circuits, and more particularly to repeater structures implemented in integrated circuits.

2. Description of Related Art

Integrated circuits are widely manufactured on semiconductor chips to process signals. Semiconductor chips are typically formed of various layers that contain a multitude of circuit components and interconnecting structures that route the signals between the various circuit components on a layer and between layers. It can be appreciated by those of skill in the art that the terms chip, integrated circuit and I.C. can have the same meaning.

One structure used for routing signals between circuit components is a wire bus. Wire buses are typically formed on metal layers of a semiconductor chip and are composed of individual signal wires. To aid in maintaining the signal integrity of a signal carried on a signal wire, shielding wires are often routed to each side of a signal wire to prevent interference from other signals or charges. As there are only a limited number of layers on each semiconductor chip, it is important that circuit designers make the most efficient use of the available routing space on each metal layer.

When the integrated circuit design and mask topology is created for a metal layer, the signal wires of a wire bus are conventionally designed to a particular wire pitch defined by a specified fabrication process or design parameter. In this instance, the term wire pitch refers to a distance between center lines of two signal wires. Thus, the wire pitch establishes the spacing of adjacent signal wires of the bus for a given metal layer. A minimum wire pitch is typically used in designing the wire bus topology so that as much of the metal layer as possible is utilized for routing signals and wasted space is minimized. The term minimum wire pitch refers to the minimum distance between the center lines of two signal wires on the same metal layer required to prevent a short and/or interference.

Relatively speaking, wire buses often span long distances on a semiconductor to interconnect the various circuit components. If the signal wires become too long, a signal conducted on the signal wire can degrade and slow. If the signal degrades too much, the performance of the circuit can be impaired, for example, by the timing of the signal to a receiving circuit drifting out of specification or the signal amplitude degrading to an unusable level. Thus, repeaters that amplify the signal are often placed on the individual signal wires of the bus to reduce signal degradation and prevent reduced performance. Some examples of repeater structures are inverters, buffers, flip-flops and logic gates. Similar to signal wires, repeaters typically contain some conductive metal, and thus, repeaters are placed in conformance with the minimum wire pitch constraints of a design so that a short does not occur.

Figure 1:
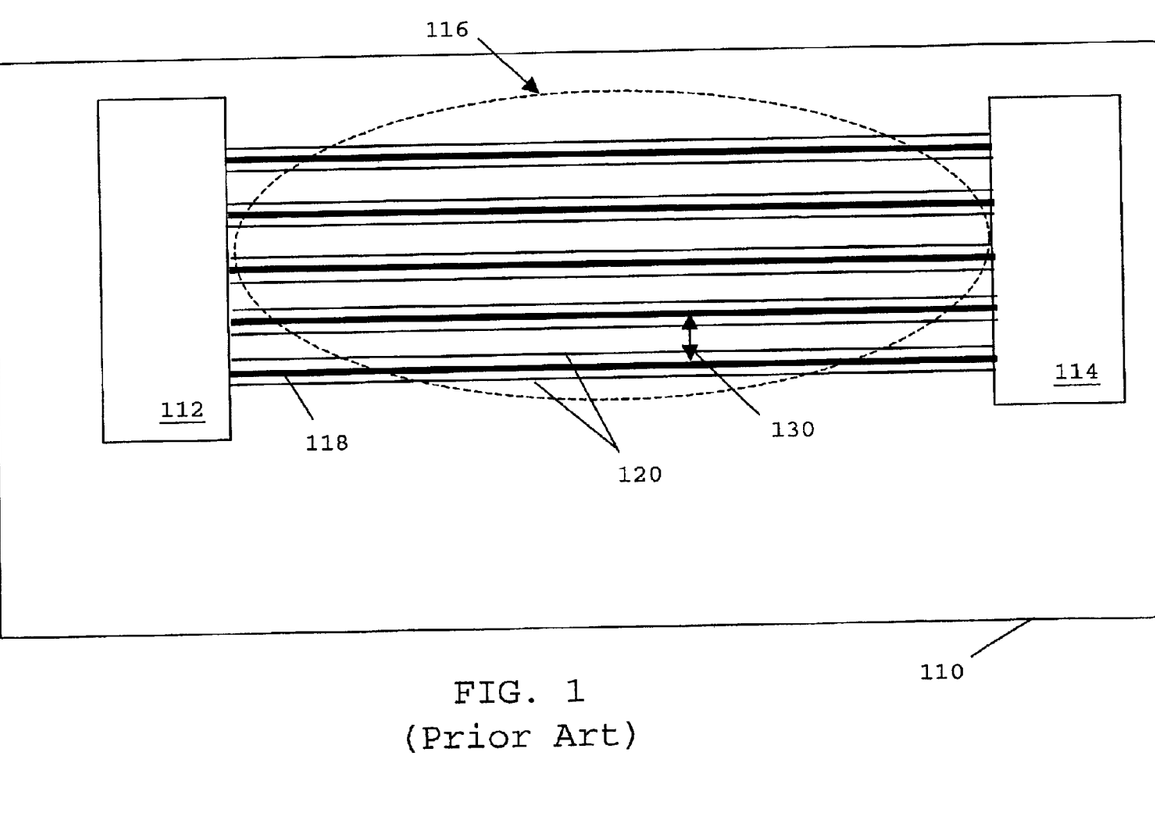
FIG. 1 illustrates a generalized integrated circuit wire bus in the prior art interconnecting two circuits on a metal layer of an integrated circuit.

FIG. 1 illustrates a generalized integrated circuit wire bus in the prior art interconnecting two circuits on a metal layer of an integrated circuit. On metal layer 110, circuit components 112 and 114 are interconnected by a wire bus 116 composed of individual signal wires 118 separated by a wire pitch 130, such as a minimum wire pitch. In the illustration, shielding wires 120 are also present to each side of an individual signal wire 118.

If the length of wire bus 116 is such that the parasitic resistance, capacitance and inductance, or other physical properties associated with wire bus 116, causes signal degradation to occur, repeaters can be introduced into the wire bus to amplify the signals. One prior art technique used to introduce repeaters on an integrated circuit wire bus is to place a repeater structure on each signal wire of the bus.

Figure 2:
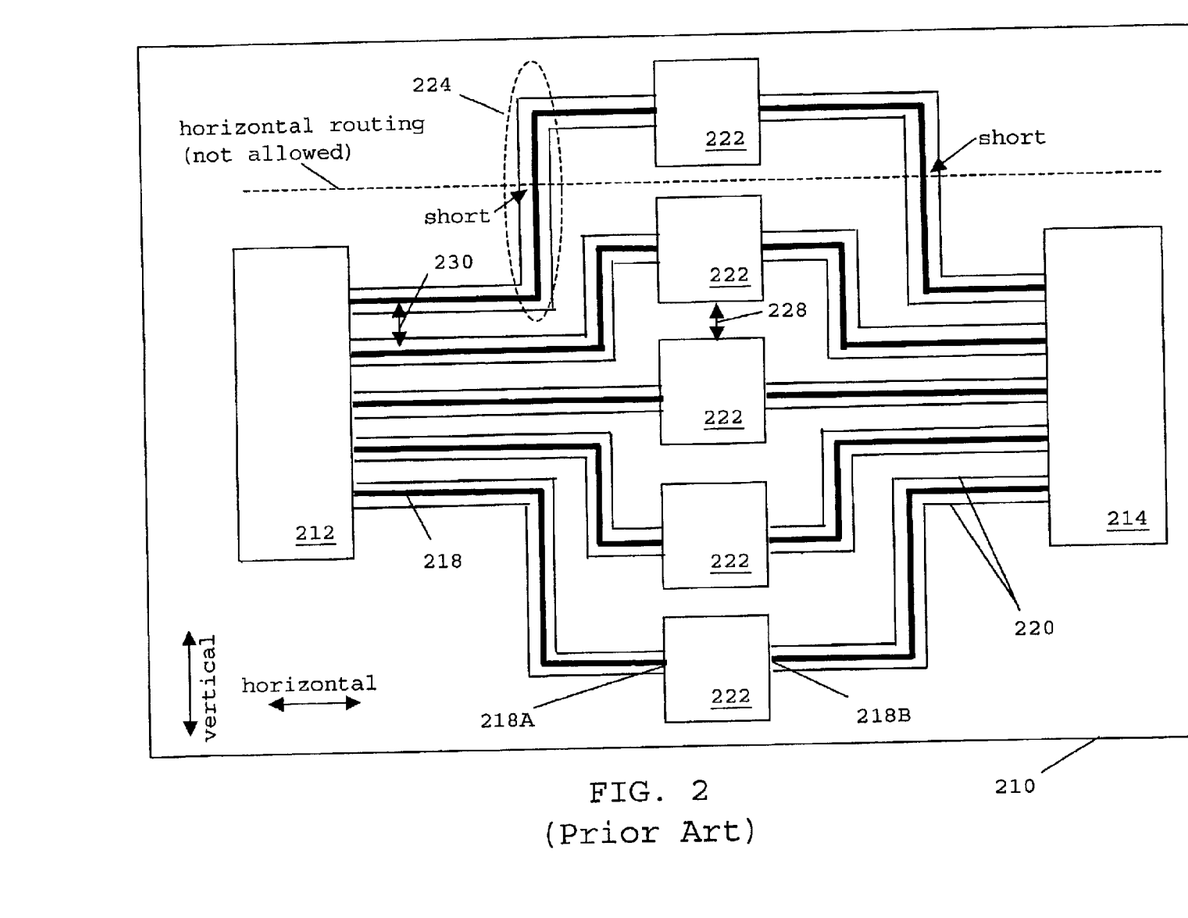
FIG. 2 illustrates a generalized integrated circuit wire bus in the prior art in which individual repeaters are located on each signal wire in the bus.

FIG. 2 illustrates a generalized integrated circuit wire bus in the prior art in which individual repeaters are located on each signal wire in the bus. In the illustration, circuit components 212 and 214 are interconnected by a integrated circuit wire bus in which individual repeaters 222 are placed on each signal wire 218 of the wire bus and coupled with the signal wire 218 at points 218A and 218B. Shielding wires 220 typically terminate at the boundaries of repeaters 222.

Currently, conventional repeaters are typically much larger than the minimum wire pitch constraints of an integrated circuit bus. For example, a minimum wire pitch constraint on signal wires of a bus can be 0.18 microns, but a typical repeater can be approximately 5.0 microns by 5.0 microns. Thus, to accommodate the repeaters 222, some or all of individual signal wires 218 of the bus are vertically spread out to maintain at least the minimum wire pitch 230 between signal wires 218 and a minimum spacing 228 between repeaters 222 as required by the manufacturing process. Where spacing 228 refers to a dimension between repeaters.

To spread out the signal wires 218 and the shielding wires 220, one or more "wire jogs" 224 are inserted. In the presently illustrated prior art technique, the vertical and horizontal segments of the signal wires 218 and shielding wires 220 used to create wire jogs 224 are located on the same metal layer. However, no horizontal routing on this metal layer can pass through the area above or below circuit component 212 and 214 where the horizontal routing is blocked by the vertical segment of the wire jog as this would create a short. For example, as illustrated in FIG. 2, a horizontal routing (shown in dashed lines) would not be allowed as it would create a short where it is blocked by the vertical segments of the wire jogs.

As illustrated, this technique increases the width of the overall bus and results in increased use of area on the metal layer by the bus. Put another way, this technique increases the footprint of the bus over that of the bus without the repeaters. Further, the increased footprint is contributed to, but not limited to, having to maintain the minimum spacing between the repeaters as required by the manufacturing process.

Routing of the signal wires and shielding wires to accommodate the repeater circuits and the placement of wire jogs in each signal wire of the bus requires tool and/or designer intervention. Thus, using this technique to insert repeaters into a bus increases the complexity of the integrated circuit design, increases expenditure of tool work and/or design time, increases the footprint of the bus on the metal layer and, typically, results in higher production costs.

Figure 3:
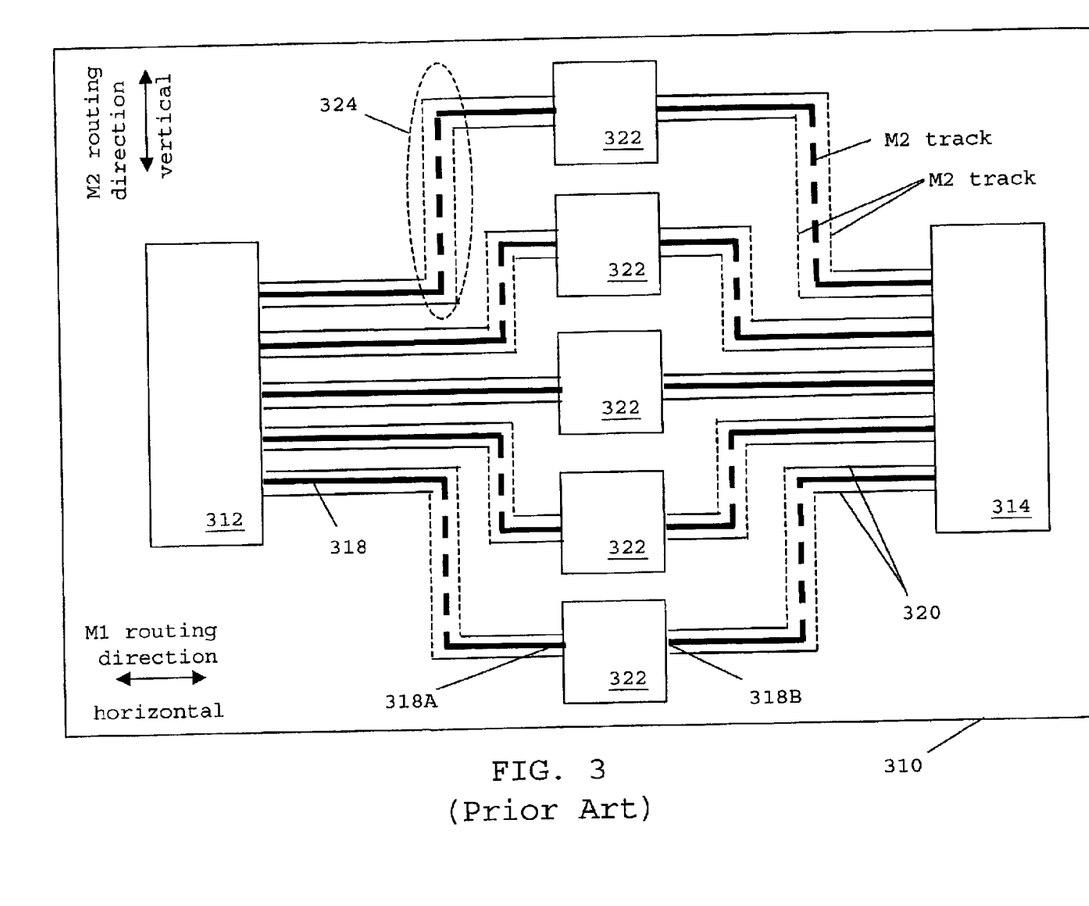
FIG. 3 illustrates a generalized view of an integrated circuit wire bus in the prior art having vertical wire segments routed on a metal layer different from that on which the horizontal wire segments are routed.

Another prior art technique, uses different metal layers on which to route the vertical segments and horizontal segments of the wires and interconnects the vertical and horizontal segments using vias between the metal layers. FIG. 3 illustrates a generalized view of an integrated circuit wire bus in the prior art having vertical wire segments routed on a metal layer different from that on which the horizontal wire segments are routed.

Conventionally, adjacent metal layers are routed orthogonal to each other by most semiconductor manufacturing processes and integrated circuit design teams. In FIG. 3, the horizontal segments of the signal and shielding wires are routed on a first metal layer 310, designated as M1, and the vertical segments are routed on a different, second metal layer, designated M2, not shown. The vertical and horizontal segments of the wires 318 and 320 are interconnected using vias (not shown) between the metal layers. This prior art technique solves the problem of the blocked routing on the original metal layer, but in turn reduces the amount of routing resources available on the layer on which the wire jog was introduced. With this technique, tool and design intervention are needed to route the vias between the vertical and horizontal segments on the different metal layers. Thus, this technique increases the complexity of the overall semiconductor design across different layers and requires further expenditure of design time. Further, fabrication of vias is typically very expensive, and thus, this second technique usually results in higher production costs.

In view of the above, it would be desirable to have a method and/or device that permits repeaters to be easily implemented in a wire bus within pre-determined wire pitch constraints. Further, it would be desirable that the method and/or device not significantly increase the design complexity of the wire bus or integrated circuit design.

SUMMARY OF THE INVENTION

According to the principles of this invention, there are provided methods and devices for implementing repeater circuits in an integrated circuit wire bus. In one embodiment, the present invention includes a parameterized bus repeater circuit cell of variable horizontal length having a vertical width of three (3) times the wire pitch of the bus to be repeated.

The present invention can be implemented in an integrated circuit bus as separate bus repeater circuit cells, or in another embodiment, as a bus repeater circuit block having a plurality of individual bus repeater circuit cells. The embodiments of the present invention are readily adaptable to design implementations using computer-aided design tools to provide automated placement and array of the bus repeater circuit cells and bus repeater circuit blocks.

In one embodiment of the present invention, a bus repeater circuit block includes: a first signal path, having a first repeater circuit; and a second signal path adjacent the first signal path having a second repeater circuit, where the second repeater circuit is horizontally staggered with respect to the first repeater circuit.

In another embodiment of the present invention, a bus repeater circuit cell for conductive coupling to an integrated circuit bus including a plurality of individual signal wires spaced according to a pre-determined wire pitch includes: a first signal path for conductively coupling to a first signal wire, the first signal path further including a repeater circuit for amplifying a signal carried on the first signal path; a second signal path for conductive coupling to a second signal wire; and a third signal path for conductive coupling to a third signal wire, where the bus repeater circuit cell has a width three times the pre-determined wire pitch.

In a further embodiment of the present invention, a bus repeater circuit block for conductive coupling to an integrated circuit bus including a plurality of individual signal wires spaced according to a pre-determined wire pitch includes: a plurality of bus repeater circuit cells, where each of the plurality of bus repeater circuit cells has a width three times the pre-determined wire pitch, each of the plurality of bus repeater circuit cells further including: a first signal path for conductively coupling to a first signal wire, the first signal path further including a repeater circuit for amplifying a signal carried on the first signal path, the repeater circuit having a horizontal length; a second signal path for conductive coupling to a second signal wire; and a third signal path for conductive coupling to a third signal wire; where each of the repeater circuits of the plurality of bus repeater circuit cells is horizontally staggered from adjacent repeater circuits by at least the horizontal length.

As a result of these and other features discussed in more detail below, methods and devices designed according to the principles of the present invention allow repeater placement within a integrated circuit bus to be implemented without significant increases in design complexity, tool intervention, or production costs when compared to the prior art techniques earlier described.

It is to be understood that both the foregoing general description and the following detailed description are intended only to exemplify and explain the invention as claimed.

BRIEF DESCRIPTION OF THE DRAWINGS

The accompanying drawings, which are incorporated in, and constitute a part of this specification illustrate embodiments of the present invention, and together with the description, serve to explain the advantages and principles of the invention.

In the drawings.

DETAILED DESCRIPTION

The invention will now be described in reference to the accompanying drawings. The same reference numbers may be used throughout the drawings and the following description to refer to the same or like structure.

According to the several embodiments of the present invention, there are provided methods and devices for implementing repeater circuits in an integrated circuit wire bus. In one embodiment, the present invention includes a parameterized bus repeater circuit cell of variable horizontal length having a vertical width of three (3) times the wire pitch of the bus to be repeated. The present invention can be implemented in an integrated circuit bus as separate bus repeater circuit cells and in another embodiment as a bus repeater circuit block having a plurality of individual bus repeater circuit cells. Herein a bus repeater circuit cell is referred to as a bus repeater cell, and a bus repeater circuit block is referred to as a bus repeater block. The embodiments of the present invention are readily adaptable to design implementations using computer-aided design tools to provide automated placement and array of the bus repeaters cells and bus repeater blocks.

The present invention allows repeater placement within a bus to be implemented without significant increases in design complexity, tool intervention, or production costs when compared to the prior art techniques earlier described.

Figure 4:
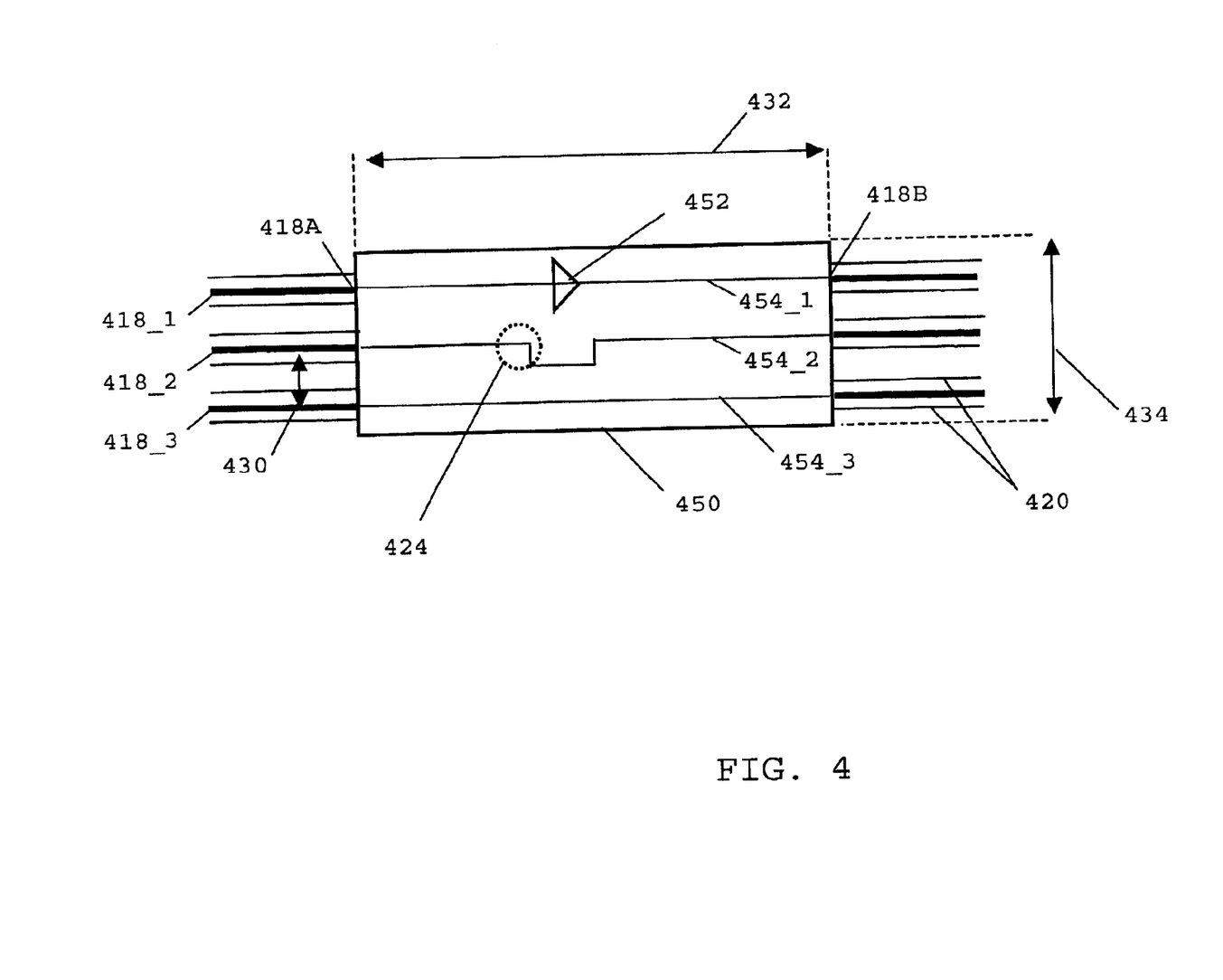
FIG. 4 illustrates a top view of a bus repeater cell according to one embodiment of the present invention.

FIG. 4 illustrates a top view of a bus repeater cell according to one embodiment of the present invention. As illustrated, in one embodiment of the invention, bus repeater cell 450 has a vertical width 434 of three (3) times the wire pitch 430 of the bus and a variable horizontal length 432.

In FIG. 4, bus repeater cell 450 is inserted into the path of three adjacent signal wires 418_1 through 418_3 at respective points 418A and 418B (shown illustrated for signal wire 418_1). The bus repeater cell 450 includes three signal paths 454_1 through 454_3 that are conductively coupled to each of the bus signal wires 418_1 through 418_3, respectively. In this example, the signal path 454_1 includes a repeater circuit 452, such as an inverter, buffer, flip-flop, logic gate, or other basic electrical circuit commonly used to amplify a signal carried on signal wire 418_1. For example, a signal can be received at the bus repeater cell 450 from signal wire 418_1 at point 418A. The repeater circuit 452 amplifies the signal and outputs the amplified signal onto signal wire 418_1 at 418B. As illustrated, signal paths 454_2 and 454_3 simply pass through the signals received from signal wires 418_2 and 418_3. Signal path 454_2 and 454_3 can be routed to accommodate the width of the repeater circuit as needed. For example, signal path 454_2 is routed using wire jogs 424, to accommodate the width of the repeater circuit 452 on the adjacent signal path 454_1. Further, the shielding wires 420 are terminated at the bus repeater cell 450. Shielding inside the repeater cell is achieved via the existing power and ground connections inside the repeater cell.

The present invention capitalizes on the typically greater horizontal length available in integrated circuit wire buses by maintaining a vertical width parameter of three (3) times the wire pitch and allowing the length parameter to vary in order to maintain the width parameter, in contrast to the prior art techniques that spread out the signal wires vertically or required multi-level via interconnects. To provide amplification of signals carried on other signal wires on the bus, additional bus repeater cells 450 can be added in the bus.

Figure 5:
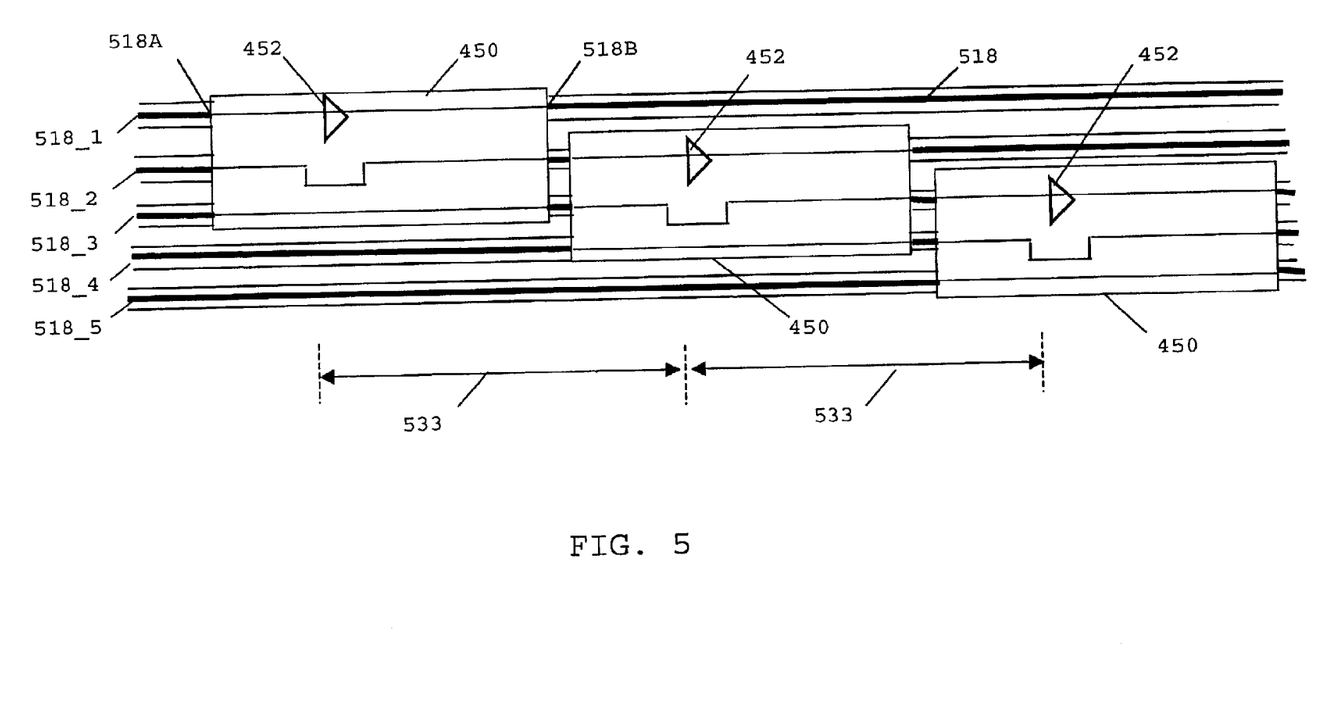
FIG. 5 illustrates a block diagram of several bus repeater cells implemented in an integrated circuit wire bus according to one embodiment of the present invention.

FIG. 5 illustrates a block diagram of several bus repeater cells implemented in an integrated circuit wire bus according to one embodiment of the present invention. As illustrated, multiple bus repeater cells 450 can be implemented in a wire bus such that each repeater circuit 452 is horizontally staggered from adjacent repeater circuits 452 by at least a horizontal distance 533 of x. For example, each repeater circuit 452 can be horizontally staggered from adjacent repeater circuits 452 by at least a horizontal distance 533 of one repeater circuit length 432.

In some design applications, it can be desirable to simply implement one large block of bus repeater cells rather than individually implementing each bus repeater cell. Thus, another embodiment of the present invention provides for a bus repeater block including a plurality of bus repeater cells.

Figure 6:
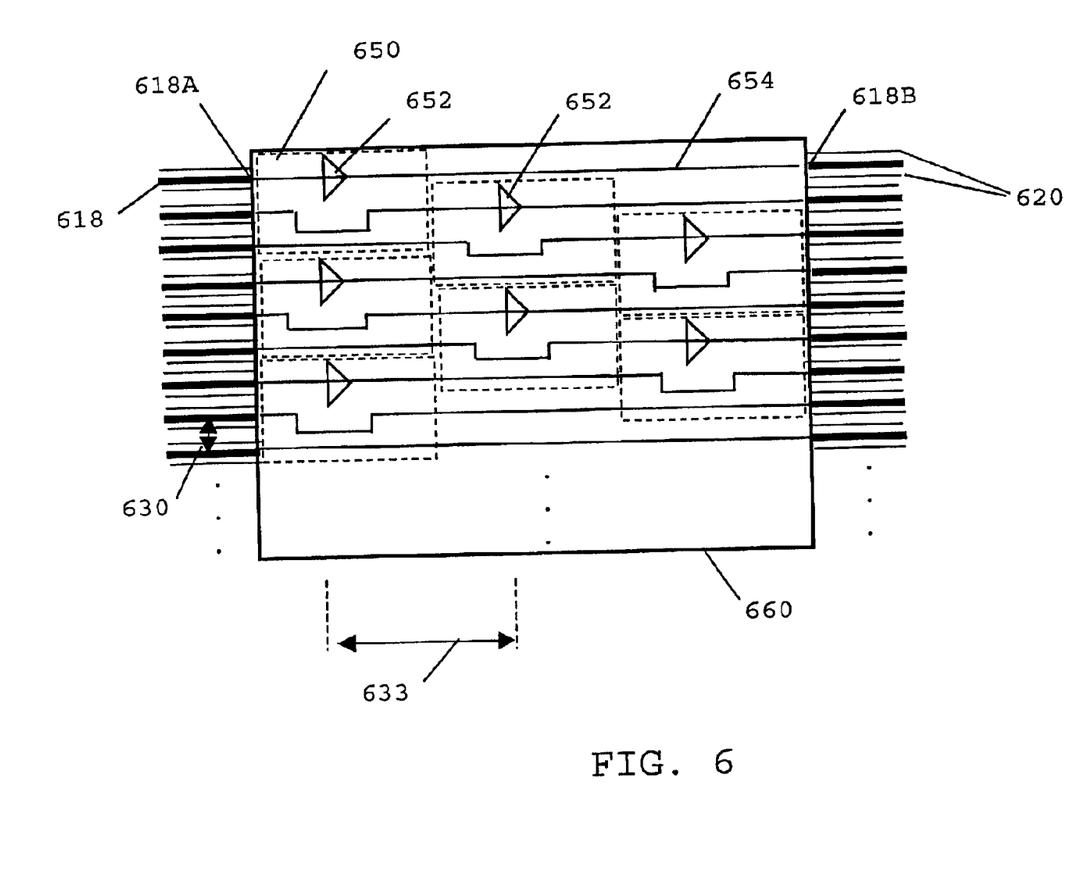
FIG. 6 illustrates a block diagram of a bus repeater block according to one embodiment of the present invention.

FIG. 6 illustrates a block diagram of a bus repeater block according to one embodiment of the present invention. For ease of description, bus repeater block 660 can be viewed as functionally including a plurality of individual bus repeater cells 650 where each bus repeater cell 650 has a vertical width of three (3) times the wire pitch 630 of the signal wires 618. Bus repeater cells 650 can be similar to the bus repeater cells 450 earlier described with reference to FIGS. 4 and 5 and herein incorporated by reference. For example, where bus repeater cells 450 can be individually packaged for easy placement in an integrated circuit bus, bus repeater cells 650 can have similar circuitry but lack the individual packaging and instead be block packaged for implementation in an integrated circuit bus.

Bus repeater block 660 includes a plurality of signal paths 654 having at least one repeater circuit 652 per signal path 654. In the present embodiment, each repeater circuit 652 is staggered a horizontal distance 633 of x from adjacent repeater circuits 652. For example, in bus repeater block 660, each of the repeater circuits 652_1 through 652_3 are horizontally staggered along the associated signal path 654_1 through 654_3 by at least a horizontal distance 633 of one repeater circuit length.

Figure 7:
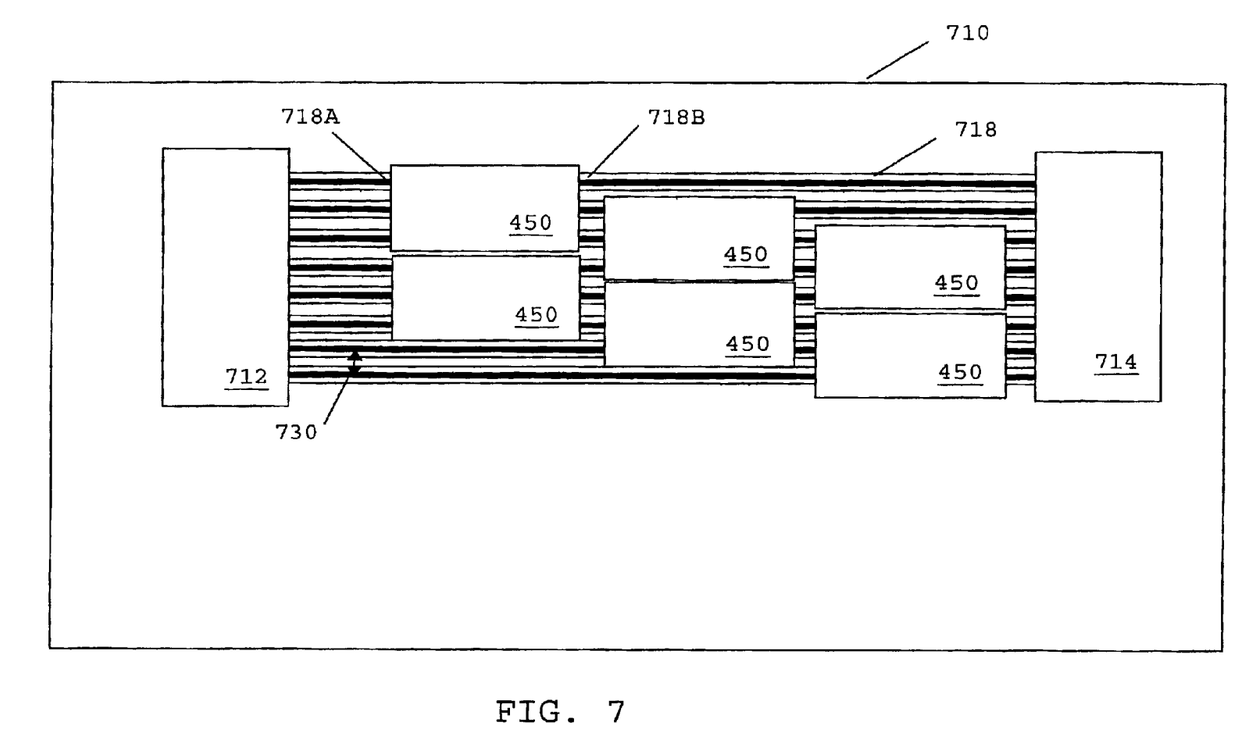
FIG. 7 illustrates a block diagram of an integrated circuit bus having bus repeater cells individually inserted along the bus according to one embodiment of the present invention.
Figure 8:
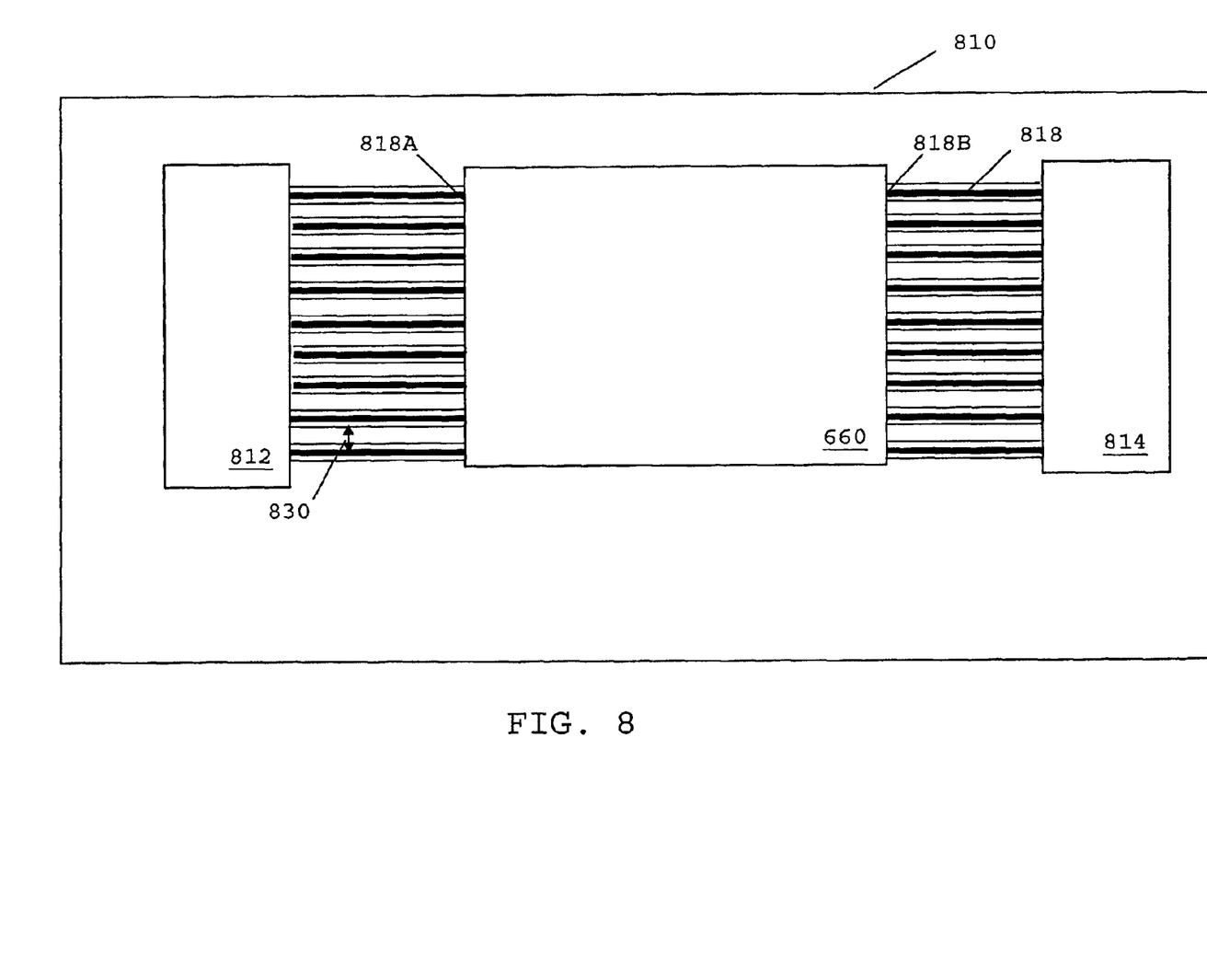
FIG. 8 illustrates a block diagram of an integrated circuit bus including a bus repeater block according to one embodiment of the present invention.

Both the bus repeater cell described with reference to FIGS. 4 and 5 and the bus repeater block described with reference to FIG. 6 can be easily implemented in an integrated circuit bus using computer-aided design tools due to the modular design of the bus repeater cells and bus repeater block. FIGS. 7 and 8 illustrate block diagrams of integrated circuit buses having repeater circuits inserted according to the present invention.

FIG. 7 illustrates a block diagram of an integrated circuit bus having bus repeater cells individually inserted along the bus according to one embodiment of the present invention. As illustrated, individual bus repeater cells 450 can be inserted into the existing bus design without affecting the wire pitch of the signal wires or requiring complex routing or via construction. For example, bus repeater cell 450 can be inserted into signal wire 718 and conductively coupled at points 718A and 718B. Routing of the signal paths is already performed during the design of the bus repeater cell 450 and thus is essentially invisible to the bus designer. The individual circuit cells 450 are horizontally staggered along the signal wires 718 such that each signal wire 718 has at least one repeater circuit and each of the repeater circuits are horizontally staggered from adjacent repeater circuits by at a horizontal distance of x, such as, at least the length of the repeater circuit.

FIG. 8 illustrates a block diagram of an integrated circuit bus including a bus repeater block according to one embodiment of the present invention. As illustrated, bus repeater block 660 can be inserted into the existing bus design without affecting the wire pitch of the signal wires or requiring complex signal wire routing or via construction. Further, rather than inserting individual bus repeater cells 450 as illustrated in FIG. 7, a single bus repeater block 660 is simply inserted into the design of the wire bus. For example, bus repeater block 660 can be inserted into each of signal wires 818 and conductively coupled at respective points 818A and 818B for each signal wire 818. Routing of the signal paths is already performed during the design of the bus repeater block 660 such that the repeater circuits are already staggered as earlier described with reference to FIG. 6. Again, routing of the signal paths and staggering of the individual repeater circuits are, thus, essentially invisible to the bus designer.

In accordance with FIGS. 4 through 8, the present invention further provides a method for implementing repeater circuits in an integrated circuit bus.

Figure 9:
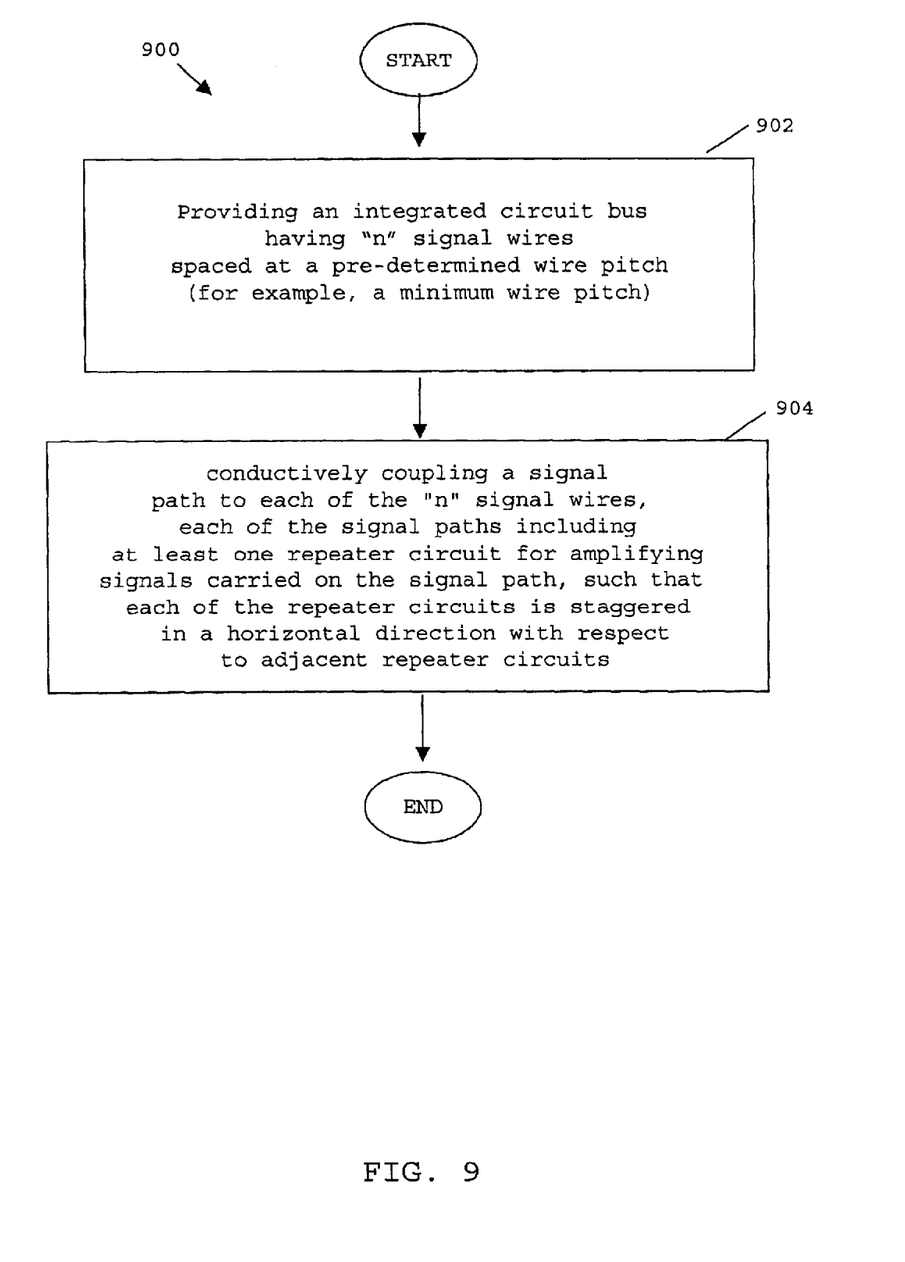
FIG. 9 illustrates a process flow diagram of a method for implementing repeater circuits in an integrated circuit bus according to one embodiment of the present invention.

FIG. 9 illustrates a process flow diagram of a method for implementing repeater circuits in an integrated circuit bus according to one embodiment of the present invention. According to method 900, in operation 902, an integrated circuit bus having "n" signal wires spaced at a specified wire pitch is provided. As earlier discussed, the specified wire pitch is often a minimum wire pitch.

In operation 904, at least one signal path is conductively coupled to each of the "n" signal wires, each signal path including at least one repeater circuit for amplifying signals carried on the signal path. Further, each of the repeater circuits is staggered in a horizontal direction with respect to adjacent repeater circuits. For example, each of the repeater circuits can be staggered a horizontal distance at least the length of the repeater circuit.

As earlier described with reference to FIGS. 4 through 8, and herein incorporated by reference, the repeater circuit can be implemented as a bus repeater cell having a vertical width three (3) times the wire pitch and as a bus repeater block including a plurality of bus repeater cells.

As a result of these and other features discussed in more detail above, the present invention provides devices and methods for implementing repeater circuits in integrated circuit buses, without the drawbacks of either of the prior art techniques. Consequently, devices designed according to the principles of the present invention can provide for less complex and less costly implementation of repeater circuits in integrated circuit buses having constrained wire pitch requirements, such as minimum wire pitch requirements.

Further, as both the bus repeater cells and bus repeater blocks of the present invention can be pre-designed, they lend themselves to automated design placement using computer-aided design tools.

The foregoing descriptions of implementations of the present invention have been presented for purposes of illustration and description, and therefore are not exhaustive and do not limit the invention to the precise forms disclosed. Modifications and variations are possible in light of the above teachings or can be acquired from practicing the invention. In particular it can be appreciated by those of skill in the art that while the present invention is described with reference to integrated circuit wire bus structures, the principles can also be applied to other bus structures that have pitch constraints on the bus paths that conduct the signals between components.

Consequently, the scope of the invention is defined by the claims and their equivalents.

I claim:

1. A bus repeater circuit block comprising:
    a first signal path, said first signal path having a first repeater circuit; and
    a second signal path adjacent said first signal path, said second signal path having a second repeater circuit, wherein said second repeater circuit is horizontally staggered with respect to said first repeater circuit.

2. The bus repeater circuit block of claim 1, wherein said first repeater circuit is of a first horizontal length, and further wherein said second repeater circuit is horizontally staggered with respect to said first repeater circuit by at least a distance of said first horizontal length.

3. The bus repeater circuit block of claim 1, further comprising:
    a third signal path adjacent said second signal path, said third signal path having a third repeater circuit, wherein said third repeater circuit is horizontally staggered with respect to said first repeater circuit and said second repeater circuit.

4. The bus repeater circuit block of claim 3, wherein said first repeater circuit is of a first horizontal length, and said second repeater circuit is horizontally staggered with respect to said first repeater circuit by at least a distance of said first horizontal length, and further wherein said third repeater circuit is of a second horizontal length, and said third repeater circuit is horizontally staggered with respect to said second repeater circuit by at least a distance of said second length.

5. The bus repeater circuit block of claim 1, wherein said repeater circuit block is implemented in an integrated circuit bus.

6. A bus repeater circuit cell for conductive coupling to an integrated circuit bus including a plurality of individual signal wires spaced according to a pre-determined wire pitch, the bus repeater circuit cell comprising:
    a first signal path, said first signal path for conductively coupling to a first signal wire, said first signal path further comprising a repeater circuit for amplifying a signal carried on said first signal path;
    a second signal path, said second signal path for conductive coupling to a second signal wire; and
    a third signal path, said third signal path for conductive coupling to a third signal wire,
    wherein said bus repeater circuit cell has a width three times the pre-determined wire pitch.

7. The bus repeater circuit cell of claim 6, wherein said first signal path is adjacent to said second signal path.

8. The bus repeater circuit cell of claim 7, wherein said second signal path is adjacent to said third signal path.

9. The bus repeater circuit cell of claim 6, wherein the pre-determined wire pitch is a minimum wire pitch.

10. A bus repeater circuit block for conductive coupling to an integrated circuit bus including a plurality of individual signal wires spaced according to a pre-determined wire pitch, the bus repeater circuit block comprising:
    a plurality of bus repeater circuit cells, wherein each of said plurality of bus repeater circuit cells has a width three times the pre-determined wire pitch, each of said plurality of bus repeater circuit cells further comprising:
        a first signal path, said first signal path for conductively coupling to a first signal wire, said first signal path further comprising a repeater circuit for amplifying a signal carried on said first signal path, said repeater circuit having a horizontal length;
        a second signal path, said second signal path for conductive coupling to a second signal wire; and
        a third signal path, said third signal path for conductive coupling to a third signal wire;
    wherein each of said repeater circuits of said plurality of bus repeater circuit cells is horizontally staggered from adjacent repeater circuits by at least said horizontal length.

11. The bus repeater circuit block of claim 10, wherein said pre-determined wire pitch is a minimum wire pitch.

12. A method for providing amplification of signals on an integrated circuit bus, said method comprising:

providing an integrated circuit bus, said integrated circuit bus comprising at least "n" individual signal wires having a pre-determined wire pitch; and conductively coupling at least one signal path to each of said "n" signal wires, each of said signal paths including at least one repeater circuit, said repeater circuit for amplifying signals carried on said signal path, wherein each of said repeater circuits is staggered in a horizontal direction with respect to adjacent repeater circuits.

13. The method of claim 12, wherein said repeater circuit is included within a bus repeater circuit cell having a width three times the pre-determined wire pitch.

14. The method of claim 13, wherein the pre-determined wire pitch is a minimum wire pitch.

15. The method of claim 12, wherein said repeater circuit is an electrical circuit commonly used to amplify a signal.

16. The method of claim 12, wherein said repeater circuit is one of the group consisting of an inverter, buffer, flip-flop, and logic gate.

17. The method of claim 12, wherein said repeater circuit has a horizontal length, and further wherein each of said repeater circuits is staggered in a horizontal direction with respect to adjacent repeater circuits by at least said horizontal length.

18. A method for providing amplification of signals on a integrated circuit bus, said integrated circuit bus comprising "n" individual signal wires, said method comprising:

providing each of said "n" individual signal wires with a signal path within a bus repeater circuit block, each of said signal paths including at least one repeater circuit, wherein each of said repeater circuits is staggered in a horizontal direction with respect to adjacent repeater circuits.

19. The method of claim 18, wherein each of said repeater circuits has a horizontal length, and further wherein each of said repeater circuits is staggered in a horizontal direction with respect to adjacent repeater circuits by at least said horizontal length.

20. An integrated circuit bus comprising:

a plurality of individual signal wires spaced according to pre-determined wire pitch; and a bus repeater circuit block conductively coupled to each of said plurality of individual signal wires, said bus repeater circuit block comprising:

a plurality of bus repeater circuit cells, wherein each of said plurality of bus repeater circuit cells has a width three times the pre-determined wire pitch, each of said plurality of bus repeater circuit cells further comprising:

a first signal path, said first signal path for conductive coupling to a first signal wire, said first signal path further comprising a repeater circuit for amplifying a signal carried on said first signal path, said repeater circuit having a horizontal length;

a second signal path, said second signal path for conductive coupling to a second signal wire adjacent said first signal wire; and a third signal path, said third signal path for conductive coupling to a third signal wire adjacent said second signal wire;

wherein each of said repeater circuits of said plurality of bus repeater circuit cells is horizontally staggered from adjacent repeater circuits by at least said horizontal length.

21. The integrated circuit bus of claim 20, wherein said pre-determined wire pitch is a minimum wire pitch.

22. An integrated circuit bus comprising:

a plurality of individual signal wires spaced according to a pre-determined wire pitch; and a plurality of bus repeater circuit cells, each of said plurality of bus repeater circuit cells being conductively coupled to each of said individual signal wires, each of said plurality of bus repeater circuit cells comprising:

a first signal path, said first signal path for conductively coupling to a first signal wire, said first signal path further comprising a repeater circuit for amplifying a signal carried on said first signal path;

a second signal path, said second signal path for conductive coupling to a second signal wire; and a third signal path, said third signal path for conductive coupling to a third signal wire;

wherein said bus repeater circuit cell has a width three times the pre-determined wire pitch.

23. The integrated circuit bus of claim 22, wherein said first signal path is adjacent to said second signal path.

24. The integrated circuit bus of claim 23, wherein said second signal path is adjacent to said third signal path.

25. The integrated circuit bus of claim 22, wherein the pre-determined wire pitch is a minimum wire pitch.

* * * * *

UNITED STATES PATENT AND TRADEMARK OFFICE
CERTIFICATE OF CORRECTION

PATENT NO. : 6,759,768 B2
DATED : July 6, 2004
INVENTOR(S) : Thomas Valine

It is certified that error appears in the above-identified patent and that said Letters Patent is hereby corrected as shown below:

Column 9,
Line 27, after "on", change "a" to -- an --.
Line 43, prior to "predetermined", insert -- a --.

Signed and Sealed this

Twenty-second Day of November, 2005

JON W. DUDAS
*Director of the United States Patent and Trademark Office*